US008492662B2

(12) United States Patent
Ballard et al.

(10) Patent No.: US 8,492,662 B2
(45) Date of Patent: Jul. 23, 2013

(54) ARC-RESISTANT DRY TYPE TRANSFORMER ENCLOSURE HAVING ARC FAULT DAMPER APPARATUS

(75) Inventors: Robert C. Ballard, Wytheville, VA (US); Nathan T. Sigman, Bastian, VA (US); Edgar A. Wimmer, Jr., Bland, VA (US); Rafael Gutierrez, Jr., Wytheville, VA (US)

(73) Assignee: ABB Inc., Cary, NC (US)

( * ) Notice: Subject to any disclaimer, the term of this patent is extended or adjusted under 35 U.S.C. 154(b) by 95 days.

(21) Appl. No.: 13/037,025

(22) Filed: Feb. 28, 2011

(65) Prior Publication Data

US 2012/0217053 A1 Aug. 30, 2012

(51) Int. Cl.
*H05K 5/00* (2006.01)
*H01F 27/02* (2006.01)

(52) U.S. Cl.
USPC ............ 174/522; 174/520; 174/50; 361/688; 361/605; 361/620; 336/90

(58) Field of Classification Search
USPC .................. 454/184; 361/605, 692, 676, 620, 361/623; 174/17 VA, 520, 522, 50; 200/306; 220/202, 203.01; 336/90
See application file for complete search history.

(56) References Cited

U.S. PATENT DOCUMENTS 2,927,736 A * 3/1960 Rohatyn ...................... 236/49.3
3,014,158 A 12/1961 Nelson et al.
5,574,624 A 11/1996 Rennie et al.
5,689,097 A 11/1997 Aufermann et al.
5,710,402 A 1/1998 Karnbach et al.
5,767,440 A * 6/1998 Byron et al. .............. 174/17 VA
5,878,905 A 3/1999 Gronbach et al.
5,892,195 A 4/1999 Aufermann et al.
6,365,826 B1 4/2002 Stendardo et al.
6,770,810 B2 8/2004 Wiebe et al.
6,827,643 B2 * 12/2004 Eiselt et al. ................... 454/184
6,940,380 B1 9/2005 Leijon
7,236,352 B2 * 6/2007 Dalis ............................. 361/608
7,643,291 B2 * 1/2010 Mallia et al. .................. 361/695
8,242,395 B2 * 8/2012 Josten et al. .................. 200/306
2005/0257439 A1 11/2005 Sarver et al.
2007/0097604 A1 * 5/2007 Bruski et al. .................. 361/605
2007/0190332 A1 8/2007 Schaal et al.
2010/0328005 A1 12/2010 Sarver et al.
2011/0043312 A1 2/2011 Yang
2012/0028559 A1 * 2/2012 Kingston ...................... 454/184

FOREIGN PATENT DOCUMENTS

CN 201112054 Y 9/2008
CN 101425361 A 5/2009
CN 201527878 U 7/2010
CN 201725652 U 1/2011

(Continued)

OTHER PUBLICATIONS

"VPI Dry Type Distribution Transformers," ABB Inc. Descriptive Bulletin 47-650 (Revised Apr. 2005) (The Musselman Group, Roanoke, VA).

(Continued)

*Primary Examiner* — Angel R Estrada
*Assistant Examiner* — Dimary Lopez
(74) *Attorney, Agent, or Firm* — Robert P. Nupp

(57) ABSTRACT

Arc resistant enclosures for dry-type transformers. More particularly, transformer enclosures having one or more arc-resistant features, including arc channels, arc fault dampers, and arc fault plenums, and methods for providing same.

10 Claims, 13 Drawing Sheets

FOREIGN PATENT DOCUMENTS

| | | | |
|---|---|---|---|
| DE | 3927013 | A1 | 2/1991 |
| GB | 2326028 | A | 12/1998 |
| WO | 2005108714 | A2 | 11/2005 |
| WO | 2012118641 | A1 | 9/2012 |
| WO | 2012118645 | A1 | 9/2012 |
| WO | 2012161778 | A1 | 11/2012 |

OTHER PUBLICATIONS

"Cast Coil Dry Type Distribution Transformers," ABB Inc. Descriptive Bulletin 47-950 (Revised Apr. 2005) (The Musselman Group, Roanoke, VA).

* cited by examiner

ARC-RESISTANT DRY TYPE TRANSFORMER ENCLOSURE HAVING ARC FAULT DAMPER APPARATUS

FIELD OF INVENTION

The present application is directed to arc resistant enclosures for dry-type transformers, and more particularly, to a transformer enclosure having one or more arc-resistant features, including arc channels, arc fault dampers, and arc fault plenums. The present application is also directed to methods for providing an arc resistant enclosure for dry-type transformers.

BACKGROUND

Dry-type distribution and small power transformers are known in the art, and include a familiar core and winding configuration. It is common to house dry-type distribution transformers in metal enclosures for the purposes of protecting the components from the environment and limiting exposure of people to the equipment, among others. Arc flash events can occur in such electrical equipment during normal operation, system transients, or during maintenance. When an electric arc occurs within the enclosure, it results in a pronounced increase in the pressure and temperature of gas within the enclosure. This sudden increase in gas pressure and temperature poses a risk of hot gas escaping the enclosure in an uncontrolled manner, which in turn poses a severe risk to people in the vicinity. It is therefore desirable to minimize such risk. In particular, it is desirable to prevent or minimize hot arc gases escaping into the area surrounding the enclosure from the floor level to a height of 2 m (79 in.) from the floor level—ie., a standard measure approximating the area within which personnel of average height would occupy if such personnel were maintaining or operating the equipment.

SUMMARY

Described herein are multiple embodiments of an arc resistant enclosure for dry-type transformer(s). In particular, in one embodiment, an arc resistant enclosure for housing dry type transformer(s) comprises base and roof structures secured to at least three walls forming an enclosed space. One of the walls is a front wall comprising a first and second corner piece, a first face frame proximate the first and second corner pieces defining a first access opening, and a first access panel arranged to cover the first access opening. At least one ventilation opening is cut into the either the roof or walls. The front wall contains at least one longitudinal seam covered by an arc channel, wherein the arc channel is attached in such a manner that, upon an arc event, arc gas is substantially prevented from escaping the enclosure through the covered longitudinal seam. In at least one embodiment, an arc fault plenum is attached to the at least one ventilation opening.

In another embodiment, an arc resistant enclosure for dry-type transformer(s) comprises base and roof structures secured to at least three walls, forming an enclosed space. At least one of the walls contains at least one ventilation grating, and at least one ventilation opening is cut into either the roof or walls. An arc fault damper apparatus is affixed adjacent at least one of the ventilation gratings; providing, however, that an arc fault damper apparatus is affixed adjacent every ventilation grating that is located at or below a height of 79 inches from the floor level. Finally, each arc fault damper apparatus is configured to close upon an arc flash event, thereby substantially preventing the escape of arc flash gas through the at least one ventilation gratings.

Methods for providing the aforementioned arc resistant enclosures are provided herein.

BRIEF DESCRIPTION OF THE DRAWINGS

In the accompanying drawings, structural embodiments are illustrated that, together with the detailed description provided below, describe exemplary embodiments of an arc resistant metal enclosures for dry-type transformers, or components thereof. One of ordinary skill in the art will appreciate that a component may be designed as multiple components or that multiple components may be designed as a single component.

Further, in the accompanying drawings and description that follow, like parts are indicated throughout the drawings and written description with the same reference numerals, respectively. The figures are not drawn to scale and the proportions of certain parts have been exaggerated for convenience of illustration.

DETAILED DESCRIPTION

The enclosures and principles disclosed in this application are applicable to dry-type transformers of various sizes and ratings. Non-limiting examples of suitable dry-type transformers for use herein include power or distribution dry transformers with power ratings from 112.5 kVA to 25MVA. Non-limiting examples of suitable commercially available dry transformers include vacuum cast coil, RESIBLOC® and open wound transformers offered by ABB, Inc.

Figure 1A:
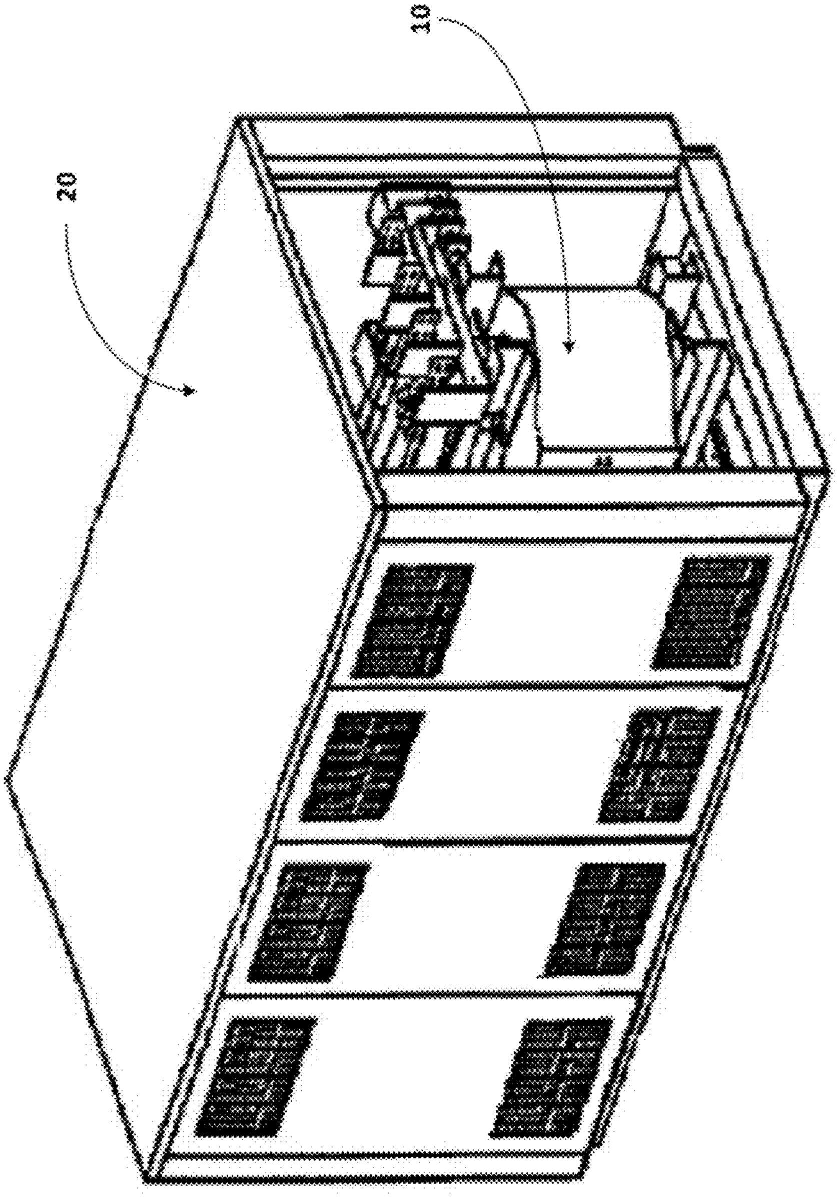
FIG. 1A is an isometric view of a prior art transformer enclosure housing a three-phase dry-type distribution transformer, with a sidewall removed.

FIG. 1A shows a typical three-phase dry-type distribution transformer 10 housed in enclosure 20. For ease of reference, dry-type transformers will be referenced hereinafter simply as transformers.

Figure 1B:
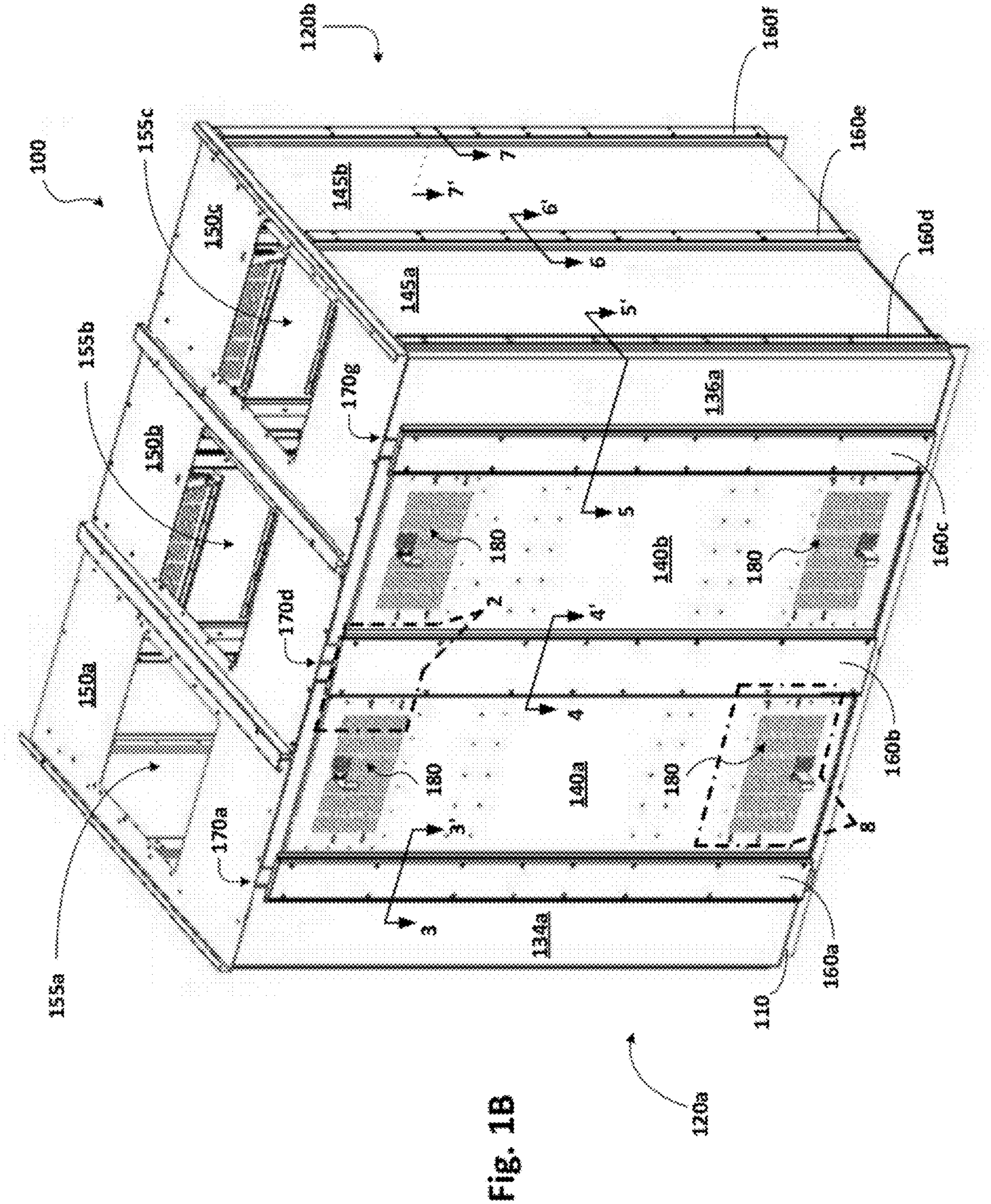
FIG. 1B is an isometric view of an exemplary arc resistant dry-type transformer enclosure, with the arc plenums removed.
Figure 1C:
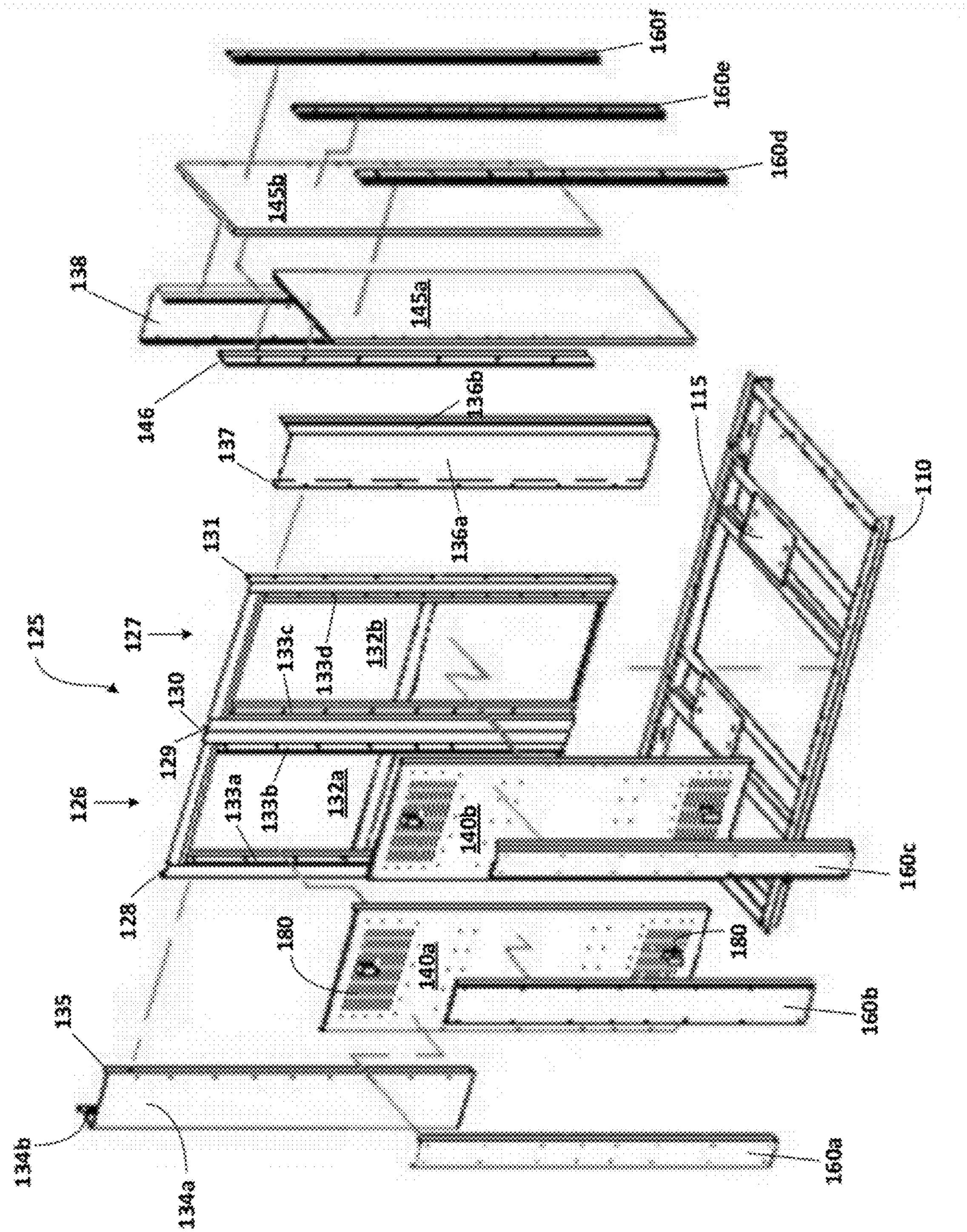
FIG. 1C is an exploded partial view of the enclosure of FIG. 1B, showing the base structure, front wall, and first sidewall.

With reference to FIGS. 1B and 1C, a transformer enclosure 100 according to one embodiment of the present invention is shown. Enclosure 100 includes a base structure 110, walls 120, and a roof structure 150. The base structure may include means for supporting a transformer (not shown) within the enclosure, such as brackets 115. The walls 120 are secured to the base structure 110, typically at the bottom portion of the walls 120. Walls 120 are preferably substantially perpendicular to the base structure 110, e.g., at an angle of approximately 90°, such as between 80°-100°. As will be appreciated, in other embodiments, walls 120 and base structure 110 may form an angle substantially different from 90°, such as 30°, 45°, 60°, 120°, 135°, 150°, and any of various angles therebetween. Walls 120 are preferably secured around the perimeter of the base structure 110. Alternatively, walls 120 are secured at any point of the base structure 110.

Although a rectangular enclosure is depicted in FIGS. 1B and 1C, it will be understood that the enclosure walls 120 may form any of a number of geometric shapes, such polygonal, i.e., triangle, square, pentagon, etc., or can be circular, oval, elliptical, and the like. Moreover, any number of walls 120 may be employed.

Roof structure 150 is secured to the top of walls 120 and may comprise one or more generally flat, rigid panels. Roof structure 150 may contain one or more ventilation openings, or holes, 155 that permit ventilation of the interior of the enclosure. In one embodiment, roof structure 150 comprises three flanged and interlocked roof panels 150*a-c*, with each roof panel containing a ventilation opening 155*a-c* in the center thereof. As will be appreciated, although a flat, multi-paneled roof structure 150 is depicted in FIGS. 1B and 1C, in other embodiments, roof structure 150 may be comprised of any suitable number of panels having any suitable geometric shape. For example, in one embodiment, roof structure 150 comprises a single flat, rigid panel containing a single ventilation opening. The roof structure and ventilation openings are described in more detail below, in the context of arc plenums.

Enclosure 100 is fabricated using generally any material that is capable of providing the functional requirements of the user, including arc fault resistance. In one embodiment, enclosure 100 is fabricated using heavy gauge sheet steel; in other embodiments, enclosure 100 is fabricated using heavy gauge aluminum or stainless steel. The enclosure 100 may comply with National Electrical Manufacturers Association (NEMA) 250 Standards.

With reference again to FIGS. 1B and 1C, in the embodiment shown, rectangular enclosure 100 has a front wall 120*a*, a first sidewall 120*b*, a back wall 120*c* (not shown), and a second sidewall 120*d* (not shown). In this embodiment, the front and back walls are similarly configured, and the first and second sidewalls are similarly configured. As such, only front wall 120*a* and first sidewall 120*b* are referenced hereinafter. As may be appreciated, in other embodiments, the walls may be differently configured.

In the embodiment shown, front wall 120*a* is comprised of a rigid face frame 125 that is itself comprised of two identical face frames 126 and 127 arranged in a coplanar and adjacent manner. Face frame 126 has first and second longitudinal edges bearing first and second longitudinal flanges 128, 129 that extend inwardly from and perpendicularly to the plane of face plate 126. Likewise, second face frame 127 has first and second longitudinal edges bearing first and second longitudinal flanges 130, 131 that extend inwardly from and perpendicularly to the plane of face frame 127. Longitudinal flanges 129, 130 are mechanically affixed, via bolts or otherwise, forming fourth longitudinal seam 170*d*, thereby providing rigid face frame 125. As will be appreciated, rigid face frame 125 may also be comprised of a single face frame, thereby eliminating the need for longitudinal flanges 129, 130.

First and second face frames 126, 127 each contain first and second access openings 132*a,b* that define a majority of the surface area of the face frames and provide access to the interior of enclosure 100. Access opening 132*a* is defined on its longitudinal sides by a pair of generally U-shaped channels 133*a,b*, that extend along the length of the access opening; likewise, access opening 132*b* is defined on its longitudinal sides by a pair of generally U-shaped channels 133*c,d*, that extend along the length of that access opening. The structure and function of channels 133 are detailed, below, in relation to FIG. 3A.

With continued reference to FIGS. 1B and 1C, the front wall 120*a* is comprised of first and second corner pieces 134, 136. Corner pieces 134, 136 are rigid, unitary panels that are curved or angled in a manner to form a first portion 134*a*, 136*a*, and a second portion 134*b*, 136*b*. The angle defined by first and second portions depends on the geometric shape of enclosure 100. In the embodiment shown, the angle is 90°. First portion 134*a*, 136*a* is generally co-planar with face plate 125 and forms part of front wall 120*a*, while second portion 134*b*, 136*b* forms part of sidewalls 120*b,d* and are co-planar with the remaining components of those wall, described below.

Corner piece 134 is adjacent first face frame 126, and the longitudinal edge of corner piece 134 that is proximate face plate 126 bears a flange 135 that is directed inwardly and perpendicularly to the plane of front wall 120*a*. Likewise, corner piece 136 is adjacent second face frame 127, and the longitudinal edge of corner piece 136 that is proximate face frame 127 bears a flange 137 that is directed inwardly and perpendicularly to the plane of front wall 120*a*. As assembled, flange 135 is mechanically affixed, by bolting or otherwise, to first flange 128 of face frame 126, forming first longitudinal seam 170*a*. Likewise, as assembled, flange 137 of corner piece 136 is mechanically affixed to second flange 131 of face frame 127, forming seventh longitudinal seam 170*g*.

Front wall 120*a* may also comprise one or more rigid access panels 140. In the embodiment shown, front wall 120*a* comprises first and second rigid access panels 140*a,b* that are configured and arranged to cover access openings 132 of face frame 125. Access panels 140 are mechanically affixed to face frame 125 by any suitable means. In one embodiment, access panels 140 are configured such that each longitudinal side is flanged in a manner to mate with U-shaped channels 133 of face frame 126, 127, and are bolted along their length to face frame 125 in the manner described below.

Front wall 120*a* may also comprise one or more ventilation gratings 180 that allow gas to pass into and out of the interior of the enclosure. In the embodiment shown, access panels 140 each contain two ventilation gratings 180. In other non-limiting embodiments, the one or more ventilation gratings are located in one or more different locations, such as sidewalls 120*b,d*, and/or back wall 120*c*.

Sidewall 120*b* comprises one or more rigid sidewall plates 145. In the embodiment shown, sidewall 120*b* comprises two identical sidewall plates separated by, and affixed to, an elongated sidewall support piece 146. Additionally, sidewall 120*b* comprises second portion 136*b* of corner piece 136, as well as an analogous second portion of counterpart corner piece 138.

Arc Channels

With continued reference to FIGS. 1B and 1C, arc channels 160 according to one embodiment of the present invention are shown. In general, arc channels 160 are elongated flat metal pieces having first and second ends 161, 162 that are positioned on the enclosure at a first point proximate the floor and a second point greater than 2 m (79 in.) above the floor level, respectively. Arc channels 160 are affixed to the outer surface of walls 120 at any longitudinal seam or portion of any longitudinal seam, as that term is defined herein, that is located anywhere from the floor level to 2 m (79 in.) from the floor level. The terms "seam" and "joint" are used interchangeably herein and refer to any longitudinal seam in the outer surface of walls 120 caused by the abutment or overlap of two adjacent wall panels, frames, or support pieces, that are likely to release expanding gas resulting from an arc fault event, and that are thereby likely to cause harm directly to any adjacent bystander or indirectly by igniting adjacent flammable material.

Figure 2A:
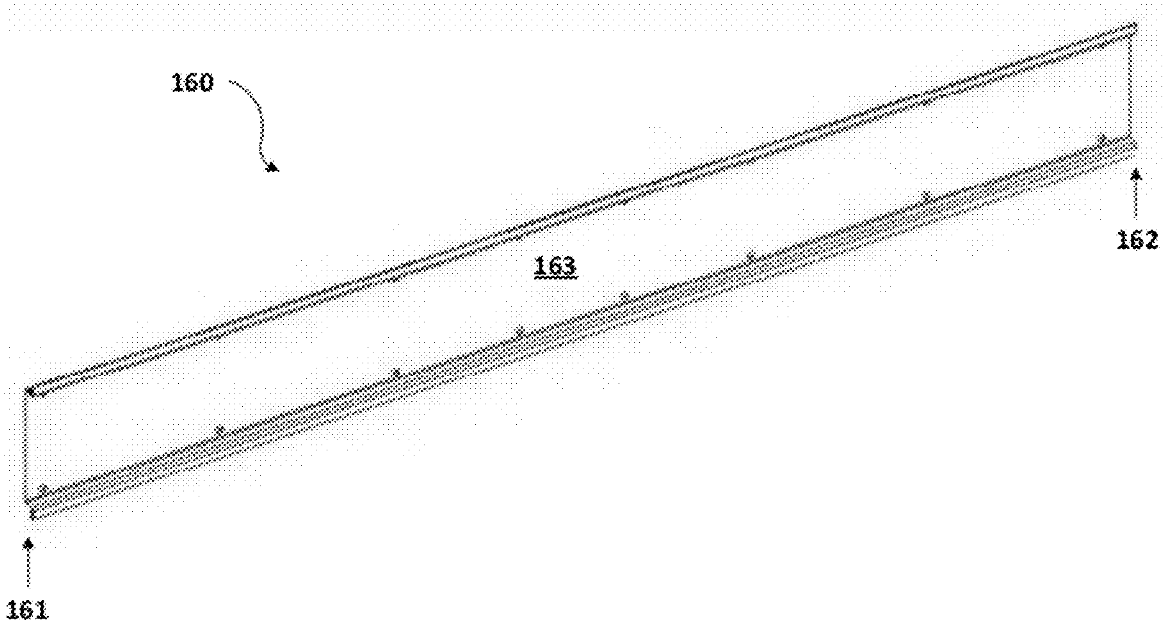
FIG. 2A is an isometric view of the inside surface of an exemplary arc channel, without end-cap pieces.
Figure 2B:
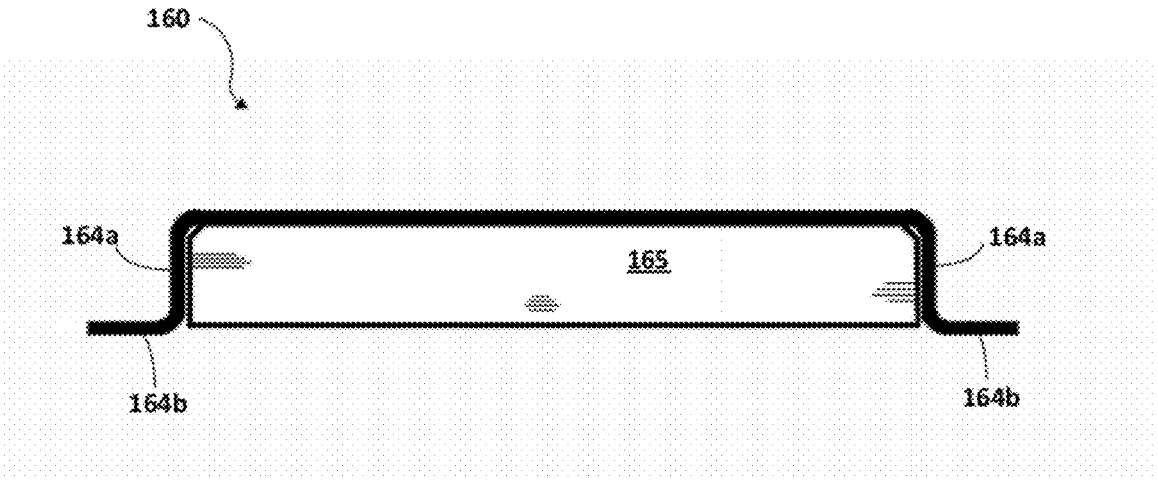
FIG. 2B is an elevational view along the longitudinal axis of the arc channel of FIG. 2A, with an end-cap piece.

Arc channels 160 act to contain rapidly expanding gases resulting from an arc fault event inside the enclosure, or to direct expanding gases to a point that will not be likely to cause harm (e.g., to a point higher than 79 in. above floor level). Referring to FIGS. 2A and 2B, in one embodiment, arc channels 160 have a central flat elongated portion 163 and two side portions 164. Side portions 164 are formed by angling each side twice at approximately 90°, creating a turned-up portion 164*a* and a flanged portion 164*b* that is approximately parallel to the central portion 163. Preferably, both ends 161 and 162 of arc channel 160 are substantially closed or capped by, for example, welding a small flat metal end-cap piece 165 to either end such that the cross-sectional area between each turned-up portion 164*a* is substantially covered, as shown in FIG. 2B. Each arc channel 160 is attached to the outer surface of the enclosure walls 120 such that the flanged portions 164*b* abut the outer surface, thereby creating an enclosed space (not shown) between the outer surface of the enclosure walls 120 and the inner surface of the flat elongated portion 163.

Figure 3A:
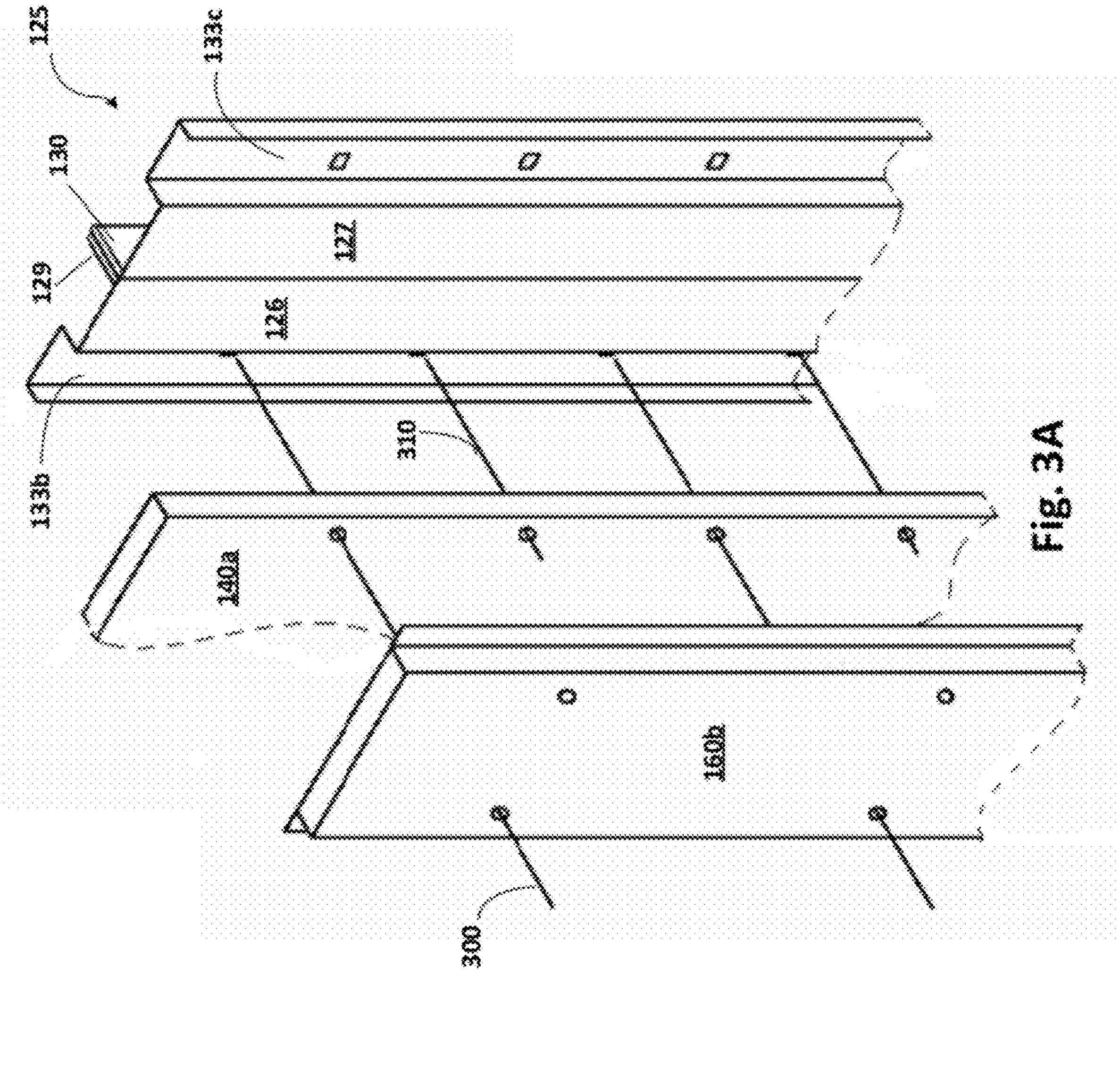
FIG. 3A is an isometric, exploded, and enlarged view of the portion shown in the dashed line 2 of FIG. 1B.

FIG. 3A is an exploded and enlarged view of the portion shown in the dashed line 2 in FIG. 1B, showing an upper section of arc channel 160*b*, a portion of access panel 140*a*, and a portion of face frames 126, 127 that are mechanically affixed by longitudinal flanges 129, 130 and that contain U-shaped channels 133*b* and 133*c*, respectively. As assembled, access panel 140*a* is brought into contact with face frame 126 such that its first longitudinal side, which is flanged perpendicularly to its surface, is seated in first U-shaped channel 133*a* (not shown) of face frame 126 and its second longitudinal side, which is also flanged perpendicularly to its surface, is seated in second U-shaped channel 133*b*. Likewise, although not shown in FIG. 3A, access panel 140*b* is brought into contact with face frame 127 such that its first longitudinal side, which is flanged perpendicularly to its surface, is seated in first U-shaped channel 133*c* of face frame 127 and its second longitudinal side, which is flanged perpendicularly to its surface, is seated in second U-shaped channel 133*d*.

With continued reference to FIG. 3A, one exemplary arc channel bolting arrangement is shown. In this embodiment, both the arc channel 160*b* and access panel 140*a* are bolted to face frame 126 using two alternating sets of bolts. A first set of bolts 300 passes through arc channel 160*b* along a line proximate one longitudinal edge of arc channel 160*b*. Thereafter, the bolts 300 pass through access panel 140*a* and screw into a securing means, e.g., a tinnerman nut (not shown), in face frame 126. A second set of bolts 310 originate inside arc channel 160*b* (i.e., the head of bolts 310 lie within the enclosed space between flat elongated portion 163 of arc channel 160 and the access panel 140), pass through access panel 140*a*, and screw into a securing means, e.g., a tinnerman nut (not shown), in face frame 126. Likewise, this bolting arrangement is utilized along a line proximate the opposite longitudinal edge of arc channel 160*b* to affix arc channel 160*b* and access panel 140*b* to face frame 127. In this manner, arc channel 160*b* covers the third, fourth, and fifth longitudinal seams 170*c,d,e*, described n more detail below.

Figure 3B:
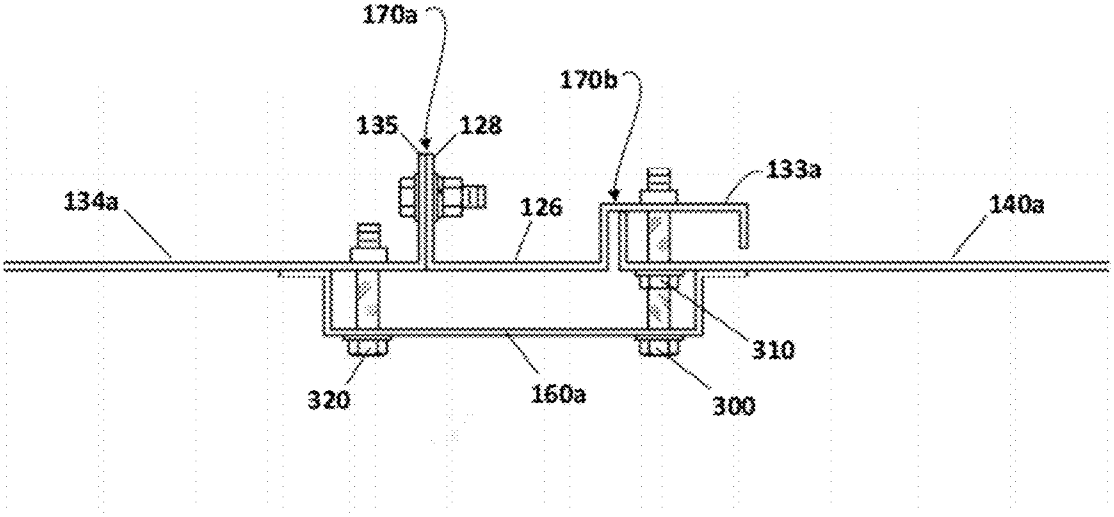
FIG. 3B is a sectional view of enclosure 100 along line 3-3' in FIG. 1B.

FIG. 3B is a sectional view of enclosure 100 along line 3-3' in FIG. 1B, showing an assembled cross-section of a portion of front wall 120*a*, and specifically portions of corner piece 134*a*, arc channel 160*a*, face frame 126, and access panel 140*a*. As shown, first longitudinal seam 170*a* is formed by the abutting flange portions 135, 128 of corner piece 134 and face frame 126, respectively. Also, second longitudinal seam 170*b* is formed by the overlapping portion of access panel 140*a* and face frame 126. A first set of bolts 320 is proximate a first longitudinal edge of arc channel 160*a*, bolting it to corner piece 134; second and third alternating sets of bolts 300, 310, bolts a second longitudinal edge of arc channel 160*b* to access panel 140*a* and face frame 126. In this manner, arc channel 160*a* covers first and second seams 170*a,b*.

Figure 3C:
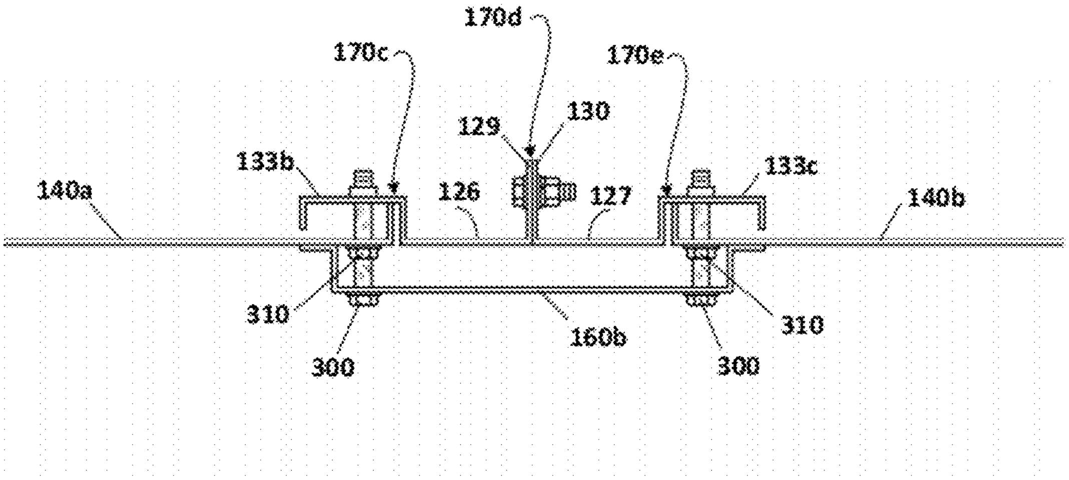
FIG. 3C is a sectional view of enclosure 100 along line 4-4' in FIG. 1B.

FIG. 3C is a sectional view of enclosure 100 along line 4-4' in FIG. 1B, showing an assembled cross-section of a portion of front wall 120*a*, and specifically portions of arc channel 160*b*, access panels 140, and face frames 126, 127. As shown, third and fifth longitudinal seams 170*c,e* are formed by overlapping portions of access panel 140 and face frames 126, 127, respectively, as described above. Similarly, fourth longitudinal seam 170*c* is formed by the abutting flange portions 129, 130 of face frames 126 and 127, respectively, as described above. Also as shown, arc channel 160*b* is bolted to access panel 140*a* and face frame 126, and access panel 140*b* and face frame 127, using bolts 300, 310, as described above, thereby covering third, fourth, and fifth longitudinal seams 170*c,d,e*.

Figure 3D:
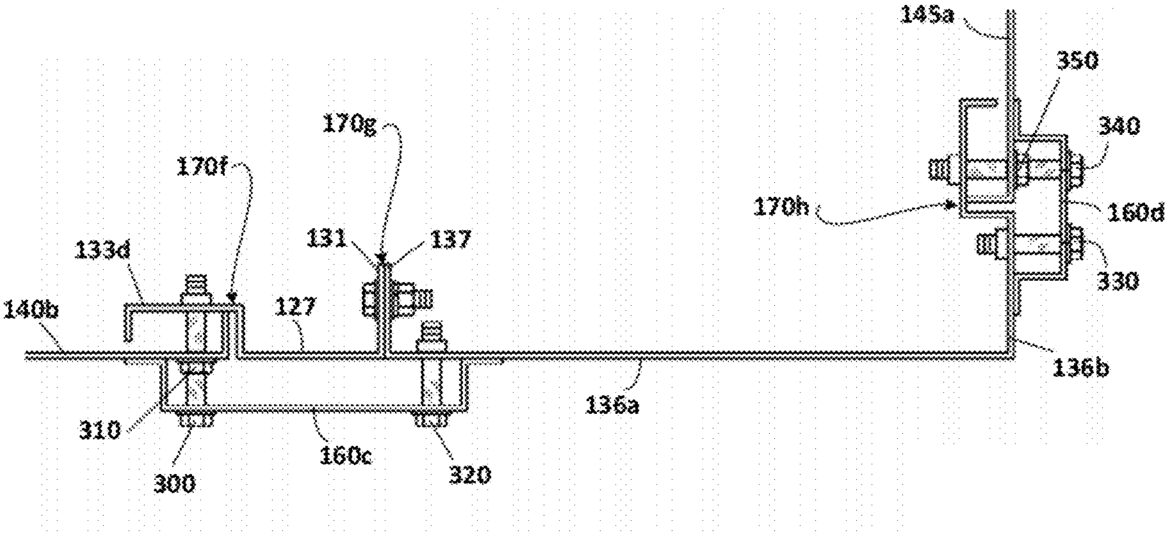
FIG. 3D is a sectional view of enclosure 100 along line 5-5' in FIG. 1B.

FIG. 3D is a sectional view of enclosure 100 along line 5-5' in FIG. 1B, showing an assembled cross section of a portion of front wall 120*a* and sidewall 120*b*, and specifically portions of access panel 140*b*, face frame 127, arc channel 160*c*, corner piece 136, arc channel 160*d*, and sidewall panel 145*a*. As shown, sixth seam 170*f* is formed by the overlapping portion of access panel 140*b* and face frame 127. Seventh seam 170g is formed by the abutting flange portions 131, 137 of face frame 127 and corner piece 136*a*, respectively. First and second alternating sets of bolts 300, 310 are proximate a first longitudinal edge of arc channel 160*c*, bolting it to access panel 140*b* and face frame 127, in the manner described above. Also, a third set of bolts 320 is proximate a second longitudinal edge of arc channel 160*c*, bolting it to corner piece 136*a*. In this manner, arc channel 160*c* covers sixth and seventh seams 170*f,g*.

With continued reference to FIG. 3D, eighth longitudinal seam 170*h* is formed by the overlapping portion of sidewall panel 145*a* and corner piece 136*b*. A first set of bolts 330 is proximate a first longitudinal edge of arc channel 160*d*, bolting it to corner piece 136*b*. Second and third alternating sets of bolts 340, 350 are proximate a second longitudinal edge of arc channel 160*d*, bolting it to sidewall panel 145*a* and to corner piece 136*b*. In this manner, arc channel 160*d* covers eighth seam 170*h*.

Figure 3E:
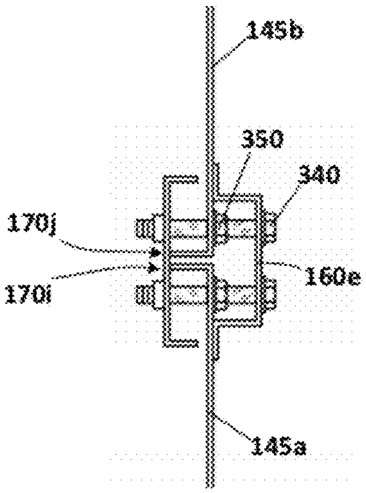
FIG. 3E is a sectional view of enclosure 100 along line 6-6' in FIG. 1B.

FIG. 3E is a sectional view of enclosure 100 along line 6-6' in FIG. 1B, showing an assembled cross section of a portion of sidewall 120*b*, and specifically portions of sidewall panels 145*a,b*, sidewall support piece 146, and arc channel 160*e*. As shown, ninth and tenth seams 170*i,j*, are formed by the overlapping portions of sidewall panels 145*a,b*, and sidewall support piece 146, respectively. First and second alternating sets of bolts 340, 350 are proximate to both longitudinal edges of arc channel 160*e*, bolting it to sidewall panels 145 and to sidewall support piece 146. In this manner, arc channel 160*e* covers ninth and tenth seams 170*i,j*.

Figure 3F:
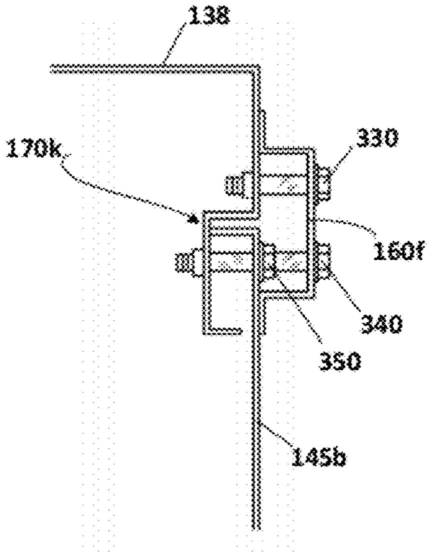
FIG. 3F is a sectional view of enclosure 100 along line 7-7' in FIG. 1B.

FIG. 3F is a sectional view of enclosure 100 along line 7-7' in FIG. 1B, showing an assembled cross section of a portion of sidewall 120*b*, and specifically portions of sidewall panel 145*b*, arc channel 160*f*, and corner piece 138. As shown, eleventh seam 170*k* is formed by the overlapping portion of sidewall panel 145*b* and corner piece 138. First and second alternating sets of bolts 340, 350 are proximate a first longitudinal edge of arc channel 160*f*, bolting it to sidewall panel 145*b* and to corner piece 138. A third set of bolts 330 is proximate a second longitudinal edge of arc channel 160*f*, bolting it to corner piece 138. In this manner, arc channel 160*f* covers eleventh seam 170*k*.

Arc channels 160*a-f*, described above, cover longitudinal seams 170*a-k*, thereby preventing or minimizing the escape of hot gas resulting from an arc flash event in the area surrounding enclosure 100 below a height of 2 m (79 in.). In this way, any personnel in the vicinity are protected from exposure to such hot gases, as well as any flammable materials. As may be appreciated, the arc channels described herein are merely one embodiment of the present invention, and different configurations, geometries, and attachment means for other arc channel embodiments are contemplated herein that may still perform the functions describe above. Likewise, different seam geometries and arrangements may be present in different enclosure embodiments, depending on the particular enclosure embodiment.

Arc Fault Damper Apparatus

Embodiments of the present invention may also include one or more arc fault damper apparatus. In general, an arc fault damper apparatus is a damper device that is located and coupled with ventilation gratings described above. According to the invention described herein, any ventilation grating that is present in an arc resistant transformer enclosure at a location that is at or below a height of 2 m (79 in.) from the floor level must have an arc fault damper apparatus coupled therewith.

Figure 4A:
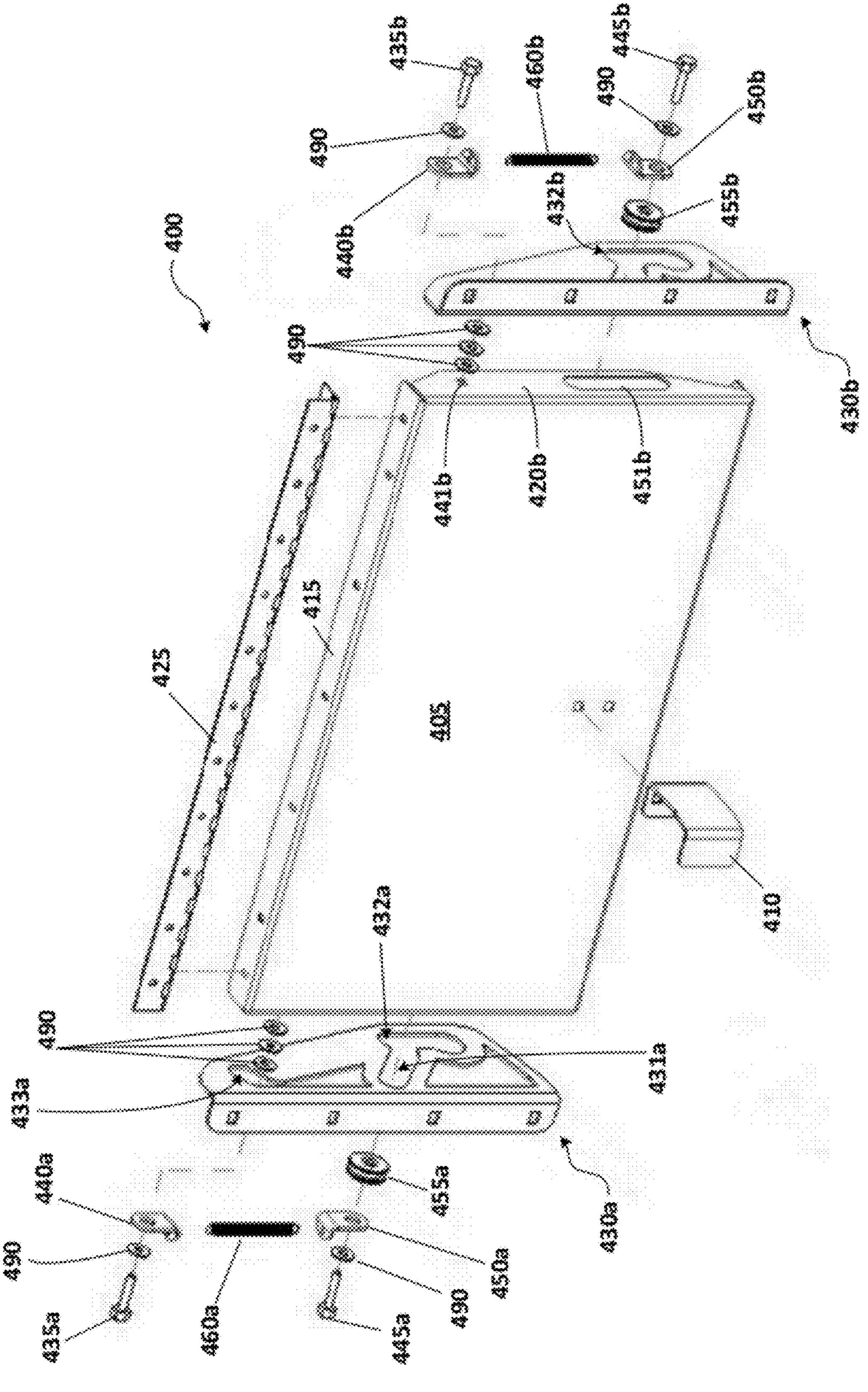
FIGS. 4A and 4B are isometric exploded views of an exemplary arc fault damper apparatus from the front and rear, respectively.
Figure 4B:
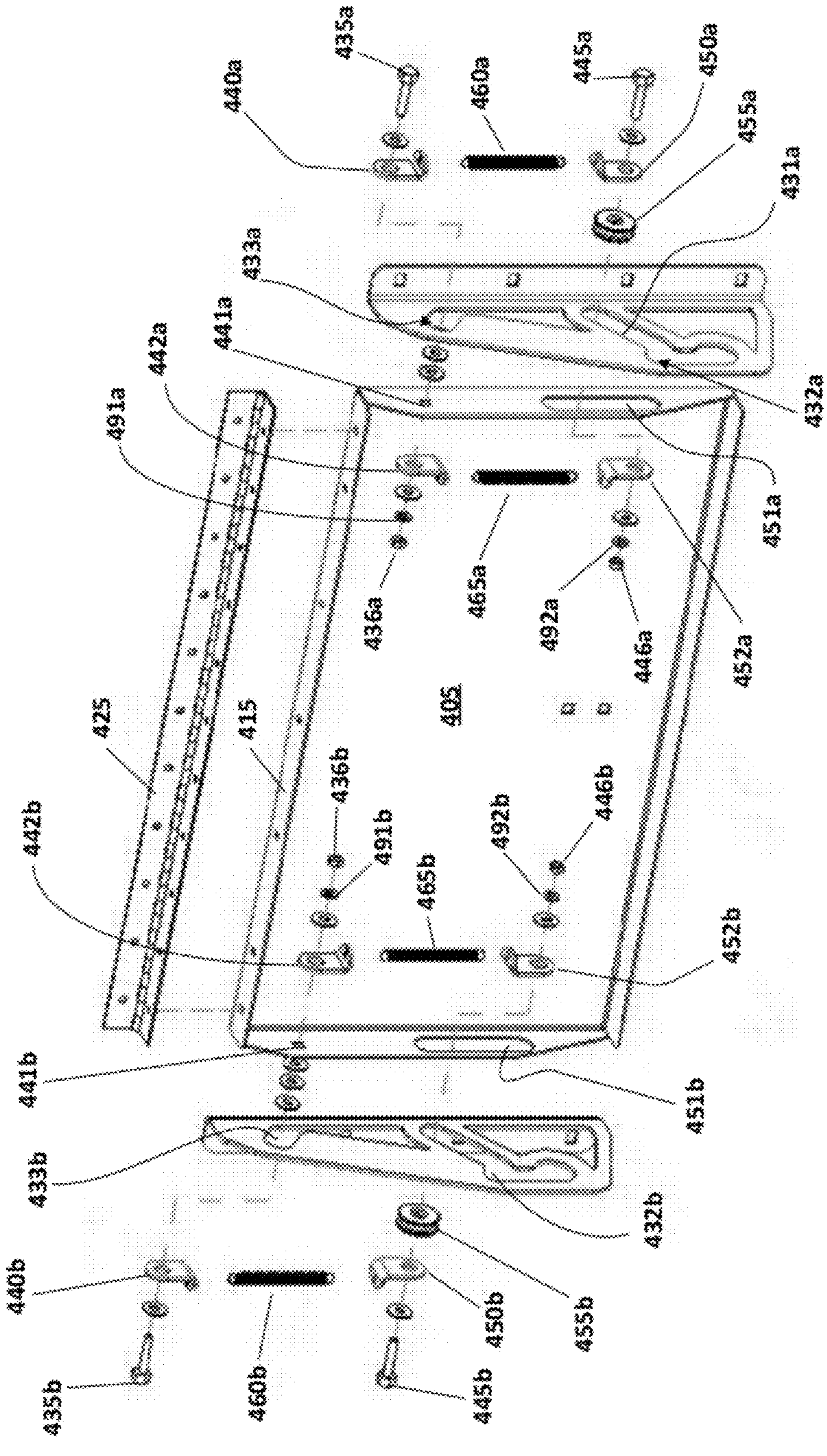

With reference to FIGS. 4A and 4B, an arc fault damper apparatus 400 according to one embodiment of the present invention is shown. Damper apparatus 400 includes a damper plate 405 that is made from any material suitable to prevent hot arc gases from escaping an enclosure and that is shaped so as to completely cover the ventilation grating that it is associated with. In one embodiment, damper plate 405 is made of steel and is rectangular, with an area greater than the area covered by ventilation grating 180. A damper handle 410 is attached to the front surface (shown in FIG. 4A) of damper plate 405 and is arranged to protrude through a suitable opening in ventilation grating 180.

In one embodiment, the top edge of damper plate 405 bears a flange 415 that extends in a direction toward the rear surface (shown in FIG. 4B) of damper plate 405, and that is perpendicular to the surface plane. Also, both side edges of damper plate 405 bear first and second side flanges 420*a,b* that extend in a direction toward the rear surface of damper plate 405 and that are perpendicular to the surface plane. Side flanges 420 each include throughhole 441 and bolt channel 451, described in more detail below.

One or more hinges are attached to the damper plate in order to rotatably attach the damper plate to the inside surface of enclosure 100. In one embodiment, elongated hinge 425 is attached to top flange 415.

Arc fault damper apparatus 400 includes one or more brackets. In one embodiment, first and second brackets 430*a,b* include a flanged portion that is substantially coplanar with the surface of damper plate 405 and a main portion that extends rearwardly from the flanged portion and that is substantially perpendicular to the flanged portion. The main portion comprises at least one wheel bearing channel 431 having a notch 432, and at least one cutout portion 433, all of which are described in more detail below.

With continued reference to FIGS. 4A and 4B, the upper portion of bracket 430 is rotatably attached to damper plate 405 by bolt 435 in the following manner. Bolt 435 extends through angled outer spring retainer 440, cutout portion 433, throughhole 441, and thereafter through inner spring retainer 442, and is secured by locking washer 491 and nut 436, which is threadably attached. Flat washers 490 are included at appropriate positions, as shown. Cutout portion 433 is configured to provide a suitable throughhole for bolt 435 at the top portion of bracket 430. In the embodiment shown, cutout portion 433 includes a relatively larger upper portion to accommodate bolt 435, a relatively narrow necking portion that has a width less than the diameter of bolt 435 (thereby preventing bolt 435 from moving past it), and a relatively large lower portion that serves to reduce the weight of the bracket 430 and to allow increased ventilation when damper plate 405 is open.

The lower portion of bracket 430 is slidably attached to damper plate 405 by bolt 445 in the following manner. Bolt 445 extends through angled outer spring retainer 450, bearing wheel 455, bearing channel 431, bolt channel 451, and thereafter through inner spring retainer 452, and is secured by locking washer 492 and nut 446, which is threadably attached. Flat washers 490 are included at appropriate positions, as shown.

Outer springs 460 are attached at a first end to outer spring retainer 440, and at a second end to outer spring retainer 450. Similarly, inner springs 465 are attached at a first end to inner spring retainer 442 and at a second end to inner spring retainer 452. Bearing wheels 455 are situated in bearing channel 431.

Figure 5A:
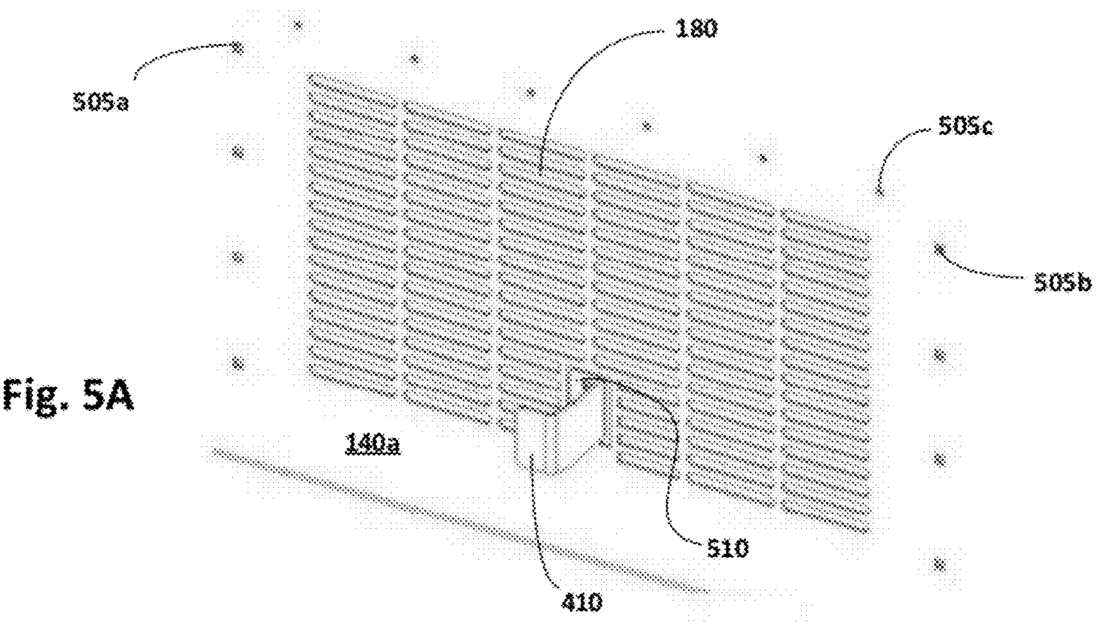
FIG. 5A is an isometric, enlarged view of the portion shown in the dashed line 8 of FIG. 1B.
Figure 5B:
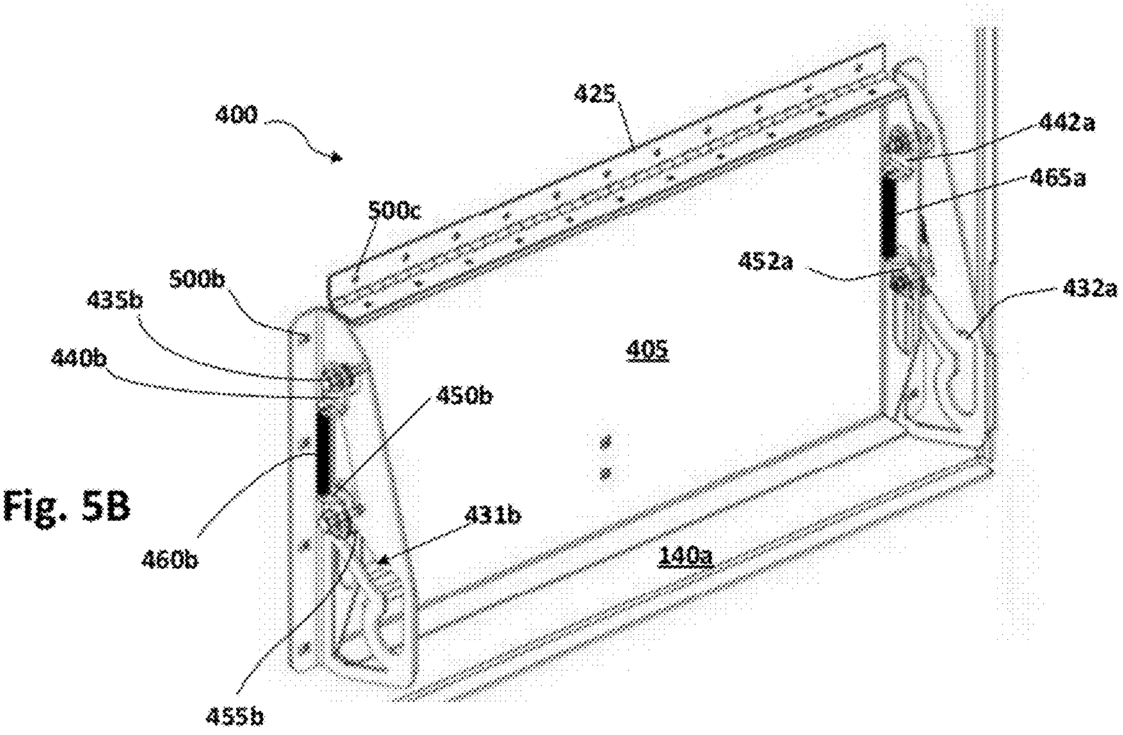
FIG. 5B is an isometric view from the rear of an exemplary arc damper apparatus in a closed configuration.

The operation of arc fault damper apparatus 400 is described with additional reference to FIGS. 5A, 5B, 6A and 6B. FIG. 5B is a rear view of arc fault damper apparatus 400, as assembled and in a closed position. Damper apparatus 400 is aligned with a ventilation grating 180, described above and shown in FIG. 5A. Side brackets 430 and hinge 425 are attached to access panel 140*a* of enclosure 100, as by bolting or the like, such that damper 405 completely covers grating 180. An exemplary bolting pattern is shown in FIGS. 5A and 5B, and comprises the aligned bolt holes 500*a,b* of side brackets 430*a,b* with bolt holes 505*a,b* of access panel 140*a*, and the aligned bolt holes 500*c* of hinge 425 with bolt holes 505*c* of access panel 140*a*.

Arc fault damper apparatus 400 is configured such that it is in a normally closed position, as shown in FIGS. 5A and 5B. In the embodiment shown, the normally closed configuration is accomplished through the use of outer and inner springs 460, 465, combined with bearing wheels 455 and an angled bearing channel 431. In particular, a first end of outer and inner springs 460, 465 is attached to outer and inner spring retainers 440, 442, respectively, which in turn are rotatably affixed in position by bolts 435. A second end of springs 460, 465 is attached to outer and inner spring retainers 450, 452, respectively, which in turn are rotatably mounted on bearing wheels 455. Bearing wheels 455, which are mounted in angled bearing channel 431, allow springs 460, 465 to transfer a contraction force into a lateral force that effectively pulls damper 405 to a closed position. As may be appreciated, other arrangements may be configured to result in a normally closed damper 405, and are encompassed herein. In one non-limiting example, bearing wheels 455 are replaced by steel pins that are capable of sliding in bearing channels 431. In another non-limiting example, torsion springs are utilized at bolts 435 in lieu of the components discussed above.

Figure 6A:
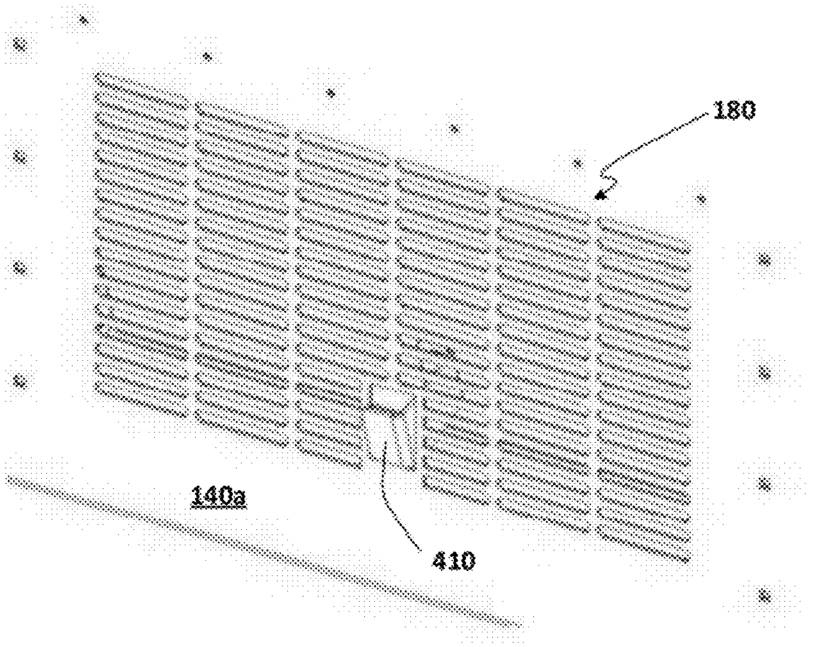
FIG. 6A is an isometric, enlarged view of the portion shown in the dashed line 8 of FIG. 1B.
Figure 6B:
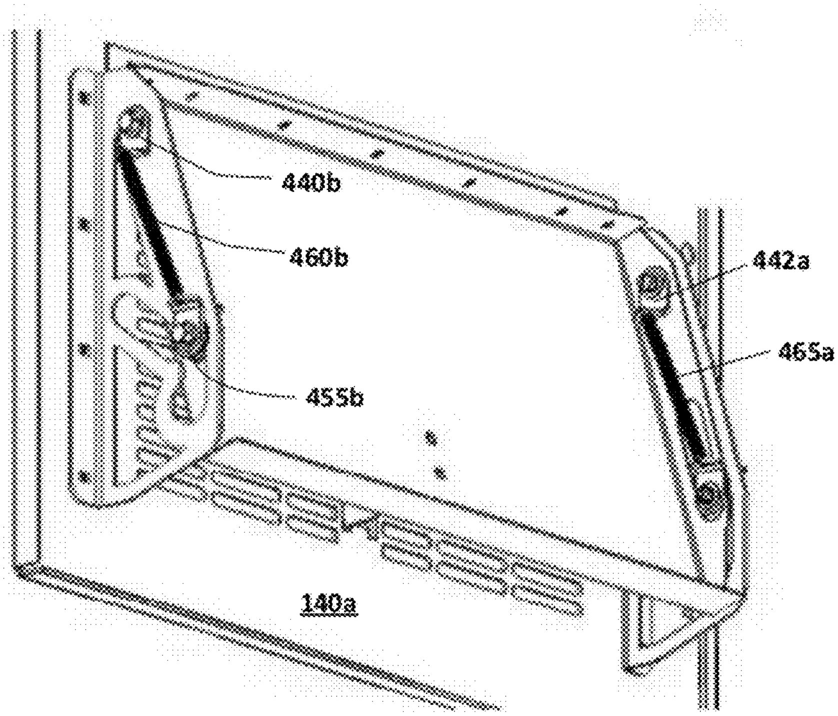
FIG. 6B is an isometric view from the rear of an exemplary arc damper apparatus in an open configuration.
Figure 7A:
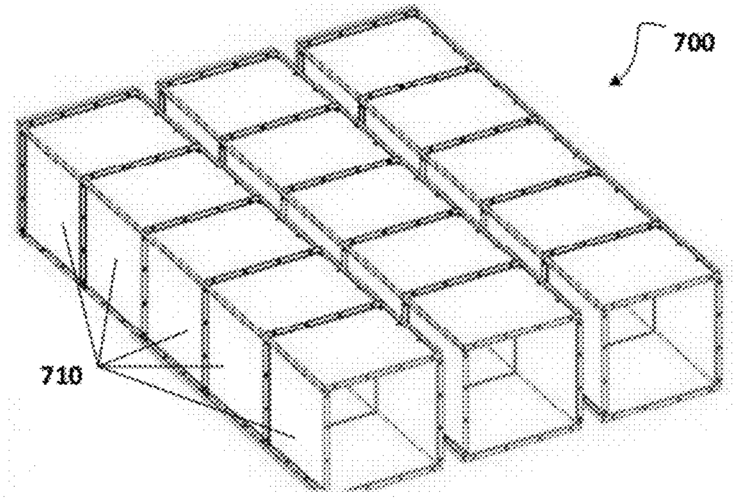
FIG. 7A is an isometric view of an exemplary arc fault plenum, viewed from above and from the rear.
Figure 7B:
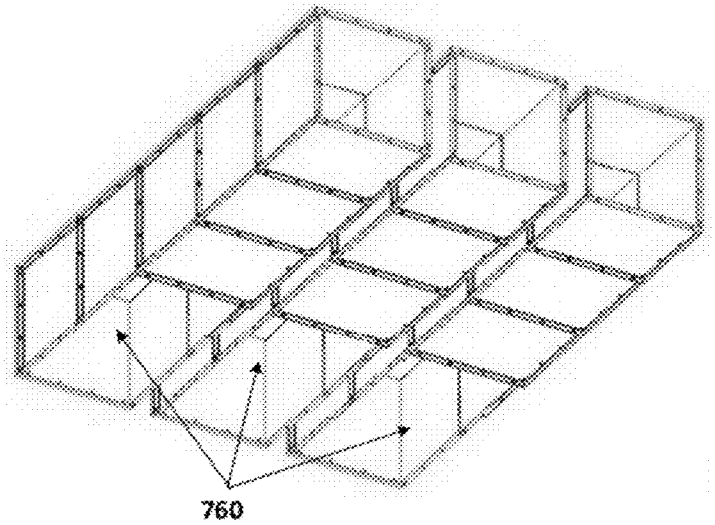
FIG. 7B is an isometric view of the arc fault plenum shown in FIG. 7A, viewed from below and from the rear.
Figure 7C:
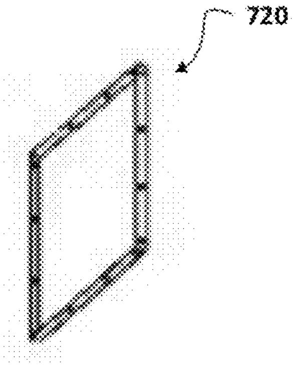
FIG. 7C is an isometric view of a flanged square piece used to build the arc fault plenum segment in FIG. 7D.
Figure 7D:
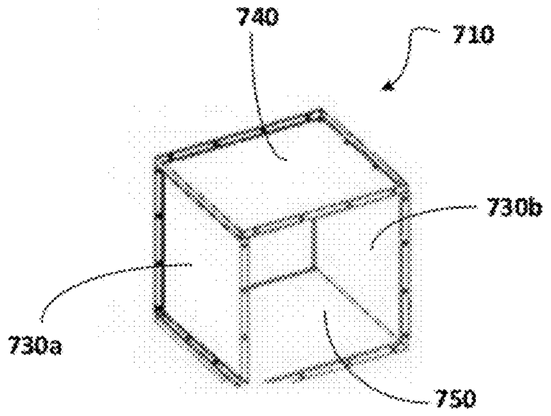
FIG. 7D is an isometric view of an arc fault plenum segment used to build the arc fault plenum in FIG. 7A.

In normal operation, an operator sets damper 405 to an open position (as shown in FIGS. 6A and 6B) by pushing damper handle 410 until bearing wheel 455 is seated in notch 432. Once seated, damper 405 will remain open and thereby allow ventilation of enclosure 100 to occur. Upon an arc event, however, the concussive force of a the rapidly expanding gases unseats bearing wheel 455, causing the damper 405 to move to a closed position, thereby preventing substantial escape of the heated arc gases from enclosure 100 through the ventilation gratings 180.

Arc Fault Plenum

Embodiments of the present invention may also include one or more arc fault plenums. In general, an arc fault plenum is an enclosure apparatus that channels expanding arc fault gases out of the arc resistant transformer enclosure to a location where they may be safely discharged.

Referring to FIGS. 7A-7D, arc fault plenums 700 according to one embodiment of the present invention are shown. In general, arc fault plenum 700 may be constructed of any material suitable for containing arc fault gases. In one non-limiting embodiment, arc fault plenum is constructed of light gauge sheet metal.

Arc fault plenum 700 may be constructed in segments 710, of any suitable shape or length, that are mechanically attached as by bolting or the like. In one non-limiting embodiment, each segment 710 is cubic and comprised of identical square pieces 720 that are flanged at each side in a direction perpendicular to its surface. Each segment 710 is formed by attaching a first flange of side square pieces 730 to a first surface (ie., the surface that does not intersect a flange) of top square piece 740 proximate two of its opposing edges. Similarly, a second flange (ie., opposite the first flange) of side square pieces 730 are attached to the first surface of bottom square piece 750 proximate two of its opposing edges. Each segment 710 is thereafter attached via flanges to another segment 710 to arrive at arc fault plenum 700, with the proviso that a bottom square piece 750 is not attached to one or more consecutive segments 710, so as to provide an open space 760.

Figures 8A, 8B:
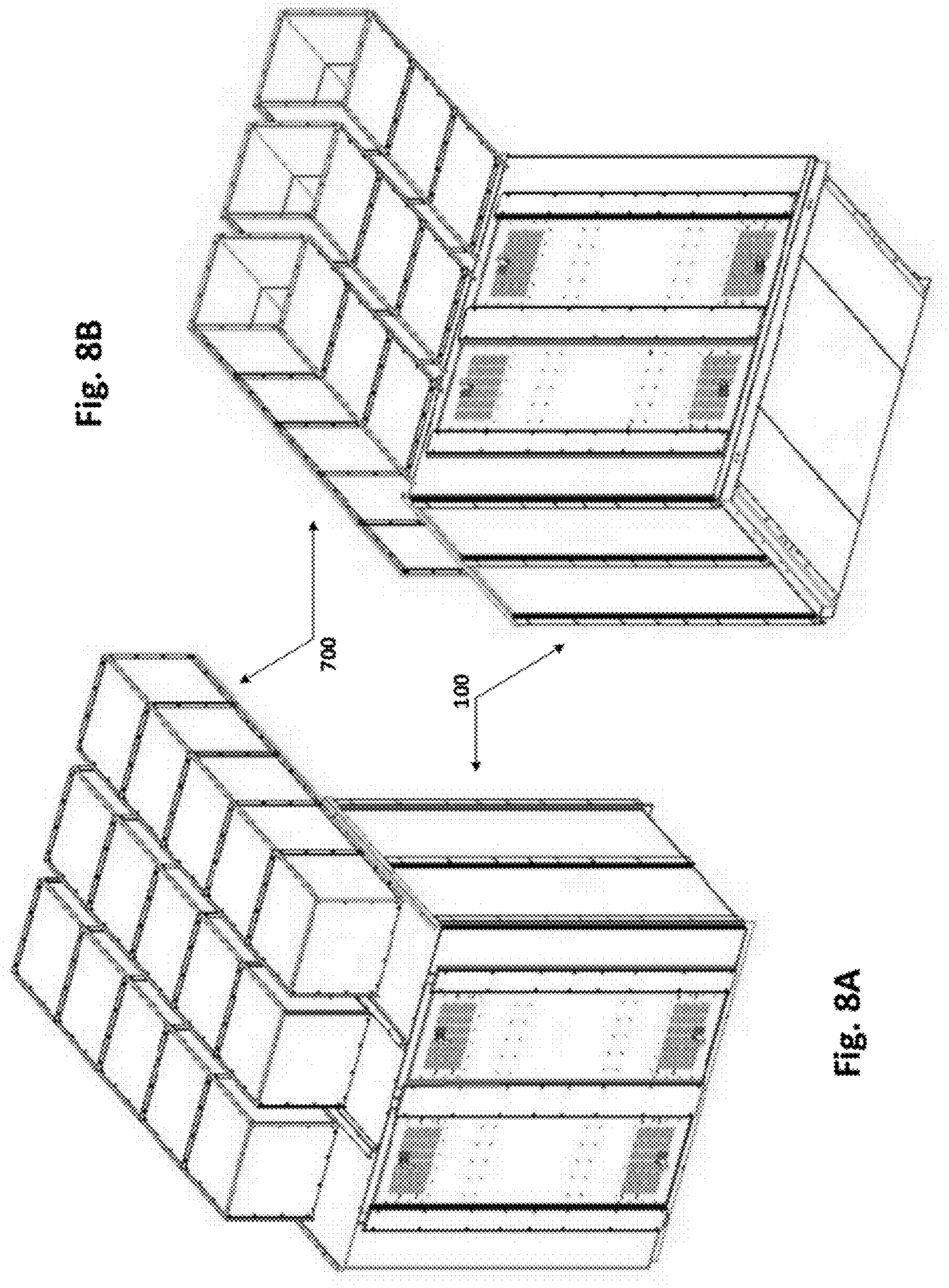
FIGS. 8A and 8B are front and rear isometric views of the exemplary arc resistant dry-type transformer enclosure of FIG. 1B, including the arc fault plenum in FIG. 7A, as attached.

Referring to FIGS. 8A and 8B, arc resistant enclosure 100 is shown having arc fault plenum 700 attached. In the embodiment shown, arc fault plenum 700 is bolted to roof structure 150 such that open spaces 760 are aligned with ventilation opening 155, shown in FIGS. 1B and 1C, and such that expanding arc fault gases may exit the interior of enclosure 100 via ventilation opening 155 and arc fault plenum 700. In one non-limiting embodiment, arc fault plenum 700 is connected to a duct system that terminates in a safe location outside of the electrical room and/or building housing enclosure 100.

As may be appreciated, other arc fault plenum and ventilation opening configurations are within the scope of the present invention. For example in one non-limiting embodiment, roof structure 150 comprises a single panel with a single ventilation opening, to which a single arc fault plenum is attached. In other non-limiting embodiments, ventilation openings 155 are provided in one or more enclosure wall 120, at a point above 2 m (79 in.) from the floor, and one or more arc fault plenums are attached thereto.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present application illustrates various embodiments, and while these embodiments have been described in some detail, it is not the intention of the applicant to restrict or in any way limit the scope of the appended claims to such detail. Additional advantages and modifications will readily appear to those skilled in the art. Therefore, the invention, in its broader aspects, is not limited to the specific details, the representative embodiments, and illustrative examples shown and described. Accordingly, departures may be made from such details without departing from the spirit or scope of the applicant's general inventive concept.

We claim:

1. An arc resistant enclosure for a dry type transformer, comprising:

- a base structure;
- a dry-type transformer seated on the base structure;
- at least three walls secured to the base structure, forming an enclosed space for housing the transformer, wherein one of the walls comprises a first and second corner piece and at least one face frame defining an access opening and wherein the at least one face frame is proximate the first and second corner pieces;
- an access panel covering the access opening, wherein the access panel contains at least one ventilation grating having an arc fault damper apparatus affixed adjacent thereto;
- a roof structure secured to the walls;
- at least one ventilation opening in either the roof or walls;
- wherein an arc fault damper apparatus is affixed adjacent at least one of the at least one ventilation gratings, with the proviso that an arc fault damper apparatus is affixed adjacent every ventilation grating that is located at or below a height of 79 inches from the floor level, and wherein each arc fault damper apparatus is configured to close upon an arc flash event, thereby substantially preventing the escape of arc flash gas through the at least one ventilation gratings.

2. The arc resistant enclosure of claim 1, wherein the at least three walls comprise a front wall, two sidewalls, and a back wall, wherein the front wall comprises a first and second corner piece, a first face frame defining a first access opening and a second face frame defining a second access opening, wherein the first face frame is proximate the first corner piece and the second face frame is proximate the first face frame and the second corner piece, wherein a first access panel covers the first access opening and a second access panel covers the second access opening, and wherein the first and second access panels each contain at least one ventilation grating having an arc fault damper apparatus affixed adjacent thereto.

3. The arc resistant enclosure of claim 2, further comprising an arc fault plenum connected to the at least one ventilation opening.

4. The arc resistant enclosure of claim 3, wherein the at least one ventilation opening is located on the roof structure.

5. The arc resistant enclosure of claim 4, wherein the roof structure contains three ventilation openings and an arc fault plenum is attached to each ventilation opening.

6. The arc resistant enclosure of claim 5, wherein each arc fault plenum comprises at least three flanged segments.

7. The arc resistant enclosure of claim 1, further comprising an arc fault plenum connected to the at least one ventilation opening.

8. The arc resistant enclosure of claim 7, wherein the at least one ventilation opening is located on the roof structure.

9. The arc resistant enclosure of claim 8, wherein the roof structure contains three ventilation openings and an arc fault plenum is attached to each ventilation opening.

10. The arc resistant enclosure of claim 9, wherein each arc fault plenum comprises at least three flanged segments.

* * * * *